United States Patent
Okada et al.

(10) Patent No.: US 8,933,394 B2
(45) Date of Patent: Jan. 13, 2015

(54) SEMICONDUCTOR DEVICE HAVING AT LEAST A TRANSISTOR CELL WITH A SECOND CONDUCTIVE TYPE REGION SURROUNDING A WALL REGION AND BEING INSULATED FROM BOTH GATE ELECTRODE AND SOURCE ELECTRODE AND SOLID STATE RELAY USING SAME

(75) Inventors: Hiroshi Okada, Mie (JP); Takuya Sunada, Osaka (JP); Takeshi Oomori, Osaka (JP)

(73) Assignee: Panasonic Corporation, Osaka (JP)

( * ) Notice: Subject to any disclaimer, the term of this patent is extended or adjusted under 35 U.S.C. 154(b) by 202 days.

(21) Appl. No.: 13/642,153

(22) PCT Filed: Feb. 23, 2011

(86) PCT No.: PCT/IB2011/000350
§ 371 (c)(1),
(2), (4) Date: Oct. 19, 2012

(87) PCT Pub. No.: WO2011/151681
PCT Pub. Date: Dec. 8, 2011

(65) Prior Publication Data
US 2013/0033300 A1    Feb. 7, 2013

(30) Foreign Application Priority Data
Jun. 3, 2010    (JP) ................. 2010-128094

(51) Int. Cl.
*H01J 5/02*    (2006.01)
(Continued)

(52) U.S. Cl.
CPC ...... *H01L 29/66068* (2013.01); *H01L 29/0696* (2013.01); *H03K 2217/0009* (2013.01);
(Continued)

(58) Field of Classification Search
USPC ........... 250/208.1, 239, 214 R; 438/381–384, 438/171, 238; 257/290–300, 440
See application file for complete search history.

(56) References Cited

U.S. PATENT DOCUMENTS

| 5,138,177 A | 8/1992 | Morgan et al. |
| 6,054,352 A | 4/2000 | Ueno |

(Continued)

FOREIGN PATENT DOCUMENTS

| DE | 692 21 354 | 11/1997 |
| DE | 198 06 838 | 8/1998 |

(Continued)

OTHER PUBLICATIONS

International Search Report for corresponding International Application No. PCT/IB2011/000350 mailed Jan. 10, 2012.

(Continued)

*Primary Examiner* — Que T Le
(74) *Attorney, Agent, or Firm* — Renner, Otto, Boisselle & Sklar, LLP (57) ABSTRACT

A semiconductor device includes one or more transistor cells mounted on a first conductive type silicon carbide (SiC) substrate, wherein each of the transistor cells includes a second conductive type wall region formed on a first surface of the SiC substrate, a first conductive type source region formed in the wall region, a gate electrode formed with a gate insulating film; a source electrode formed in such a way as to be brought into contact with the source region, and a drain electrode formed on a second surface of the SiC substrate. The semiconductor device further includes a second conductive type region located close to an outside of an outermost cell of the transistor cells, the second conductive type region surrounding the wall region and being insulated from both of the gate electrode and the source electrode.

10 Claims, 8 Drawing Sheets

(51) Int. Cl.
  *H01L 29/06* (2006.01)
  *H03K 17/687* (2006.01)
  *H01L 25/16* (2006.01)
  *H01L 29/78* (2006.01)
  *H01L 29/66* (2006.01)
  *H01L 29/16* (2006.01)
  *H03K 17/785* (2006.01)

(52) U.S. Cl.
  CPC ....... *H03K 17/6874* (2012.01); *H01L 29/1608* (2013.01); *H01L 29/0619* (2013.01); *H01L 25/167* (2013.01); *H01L 29/7811* (2013.01); *H03K 17/785* (2013.01)
  USPC ...................................... 250/239; 250/208.1

(56) References Cited

U.S. PATENT DOCUMENTS

| | | | |
|---|---|---|---|
| 7,262,108 B2 * | 8/2007 | Park et al. | ............ 438/384 |
| 2007/0170436 A1 | 7/2007 | Sugawara | |
| 2007/0221953 A1 | 9/2007 | Sakamoto | |
| 2011/0220913 A1 | 9/2011 | Hatakeyama | |

FOREIGN PATENT DOCUMENTS

| | | |
|---|---|---|
| JP | 2002-33479 | 1/2002 |
| JP | 2003-282888 | 10/2003 |
| JP | 2005-166851 | 6/2005 |
| JP | 2006-344802 | 12/2006 |
| JP | 2007/81174 | 3/2007 |
| JP | 2007-288172 | 11/2007 |
| JP | 2010-16103 | 1/2010 |
| JP | 2011-187767 | 9/2011 |
| WO | 2005/076369 | 8/2005 |

OTHER PUBLICATIONS

Form PCT/ISA/237 for corresponding International Application No. PCT/IB2011/000350 dated Jan. 10, 2012.
Japanese Office Action dated Apr. 15, 2014 for corresponding Japanese Application No. 2010-128094 and English summary thereof.
Y.C. Kao and E.D. Wolley. "High-Voltage Planar *p-n* Junctions." *Proceedings of the IEEE* 55.8 (Aug. 1967): 1409-14.
German Office Action issued on Sep. 18, 2014 in a corresponding German application No. 11 2011 101 874.6 and the English translation thereof.

* cited by examiner

SEMICONDUCTOR DEVICE HAVING AT LEAST A TRANSISTOR CELL WITH A SECOND CONDUCTIVE TYPE REGION SURROUNDING A WALL REGION AND BEING INSULATED FROM BOTH GATE ELECTRODE AND SOURCE ELECTRODE AND SOLID STATE RELAY USING SAME

FIELD OF THE INVENTION

The present invention relates to a semiconductor device and a solid state relay using same; and, more particularly, to a semiconductor device including a compound semiconductor such as a SiC semiconductor, and a solid state relay using same.

BACKGROUND OF THE INVENTION

There has been known a light coupled solid state relay including a light emitting element which emits lights according to an input signal; and a light receiving element which receives an optical signal from the light emitting element to produce an electromotive force. In the light coupled solid state relay, an output MOSFET (Metal Oxide Silicon Field Effect Transistor) is turned on and off by using the electromotive force. The solid state relay has been employed for various uses since it has a small On-resistance and a small volume and can control a fine analog signal.

The solid state relay includes a light emitting element, such as an LED, which generates an optical signal in response to an input signal; a photodiode array which receives the optical signal and produces an electromotive force; a photoelectric conversion unit including a charge and discharge circuit which charges and discharges the produced electromotive force; and an output element including a MOSFET which performs connection and disconnection according to a voltage from the charge and discharge circuit.

As for such a MOSFET, a SiC-MOSFET made of SiC has drawn attention thanks to its high withstand voltage and small On-resistance. In this regards, a power transistor where a plurality of transistor cells are arranged in an active area included in a SiC substrate has been in the mainstream. However, it is difficult to increase the withstand voltage due to the breakdown caused by the electric field concentration generated around the transistor cells.

Accordingly, various ideas have been suggested. As one of them, there is disclosed a MOSFET in which a floating ring is formed by introducing a first conductive impurity into an annular portion located at the periphery of an active area (see, e.g., Japanese Patent Application Publication No. 2006-344802).

Figure 9:
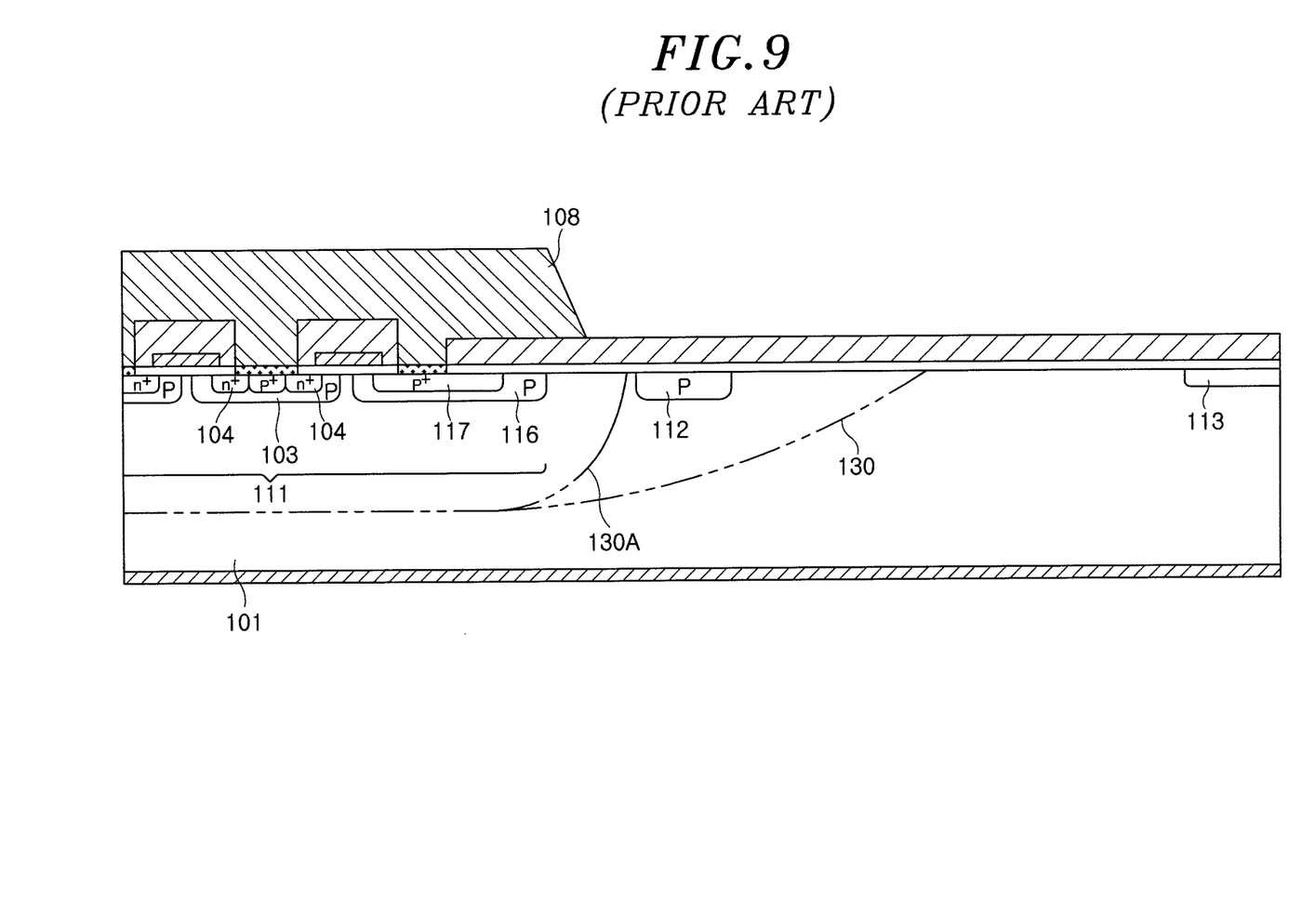
FIG. 9 is a cross sectional view showing a conventional solid state relay.

In a solid state relay disclosed in the above-cited reference, as shown in FIG. 9, an active area 111 serving as a FET (Field Effect Transistor) is formed on a SiC semiconductor substrate 101. An inner ring 116 is disposed at a peripheral portion of the active area 111, the potential of the inner ring 116 being fixed to a same level as the potential of a source electrode 108. Further, an electrically floating ring 112 is disposed to be separated from the inner ring 116 with a predetermined interval therebetween. Furthermore, an outer ring 113 serving as a drain region is disposed at a peripheral portion of the SiC semiconductor substrate 101, the potential of the outer ring 113 being fixed to a same level as the potential of the SiC semiconductor substrate 101.

Specifically, in the solid state relay disclosed in Japanese Patent Application Publication No. 2006-344802, the inner ring 116 is provided at an outermost peripheral portion of the active area 111 serving as a FET, and connected to the source electrode 108 via a contact 117. Then, the uniformity and stability of an electric field distribution in the vicinity of the active area 111 are obtained by fixing the potentials of the inner ring 116 and the outer ring 113 to same levels as those of the source region 104 and a drain, respectively.

Further, the floating ring 112 is disposed outside the inner ring 116. A depletion layer 130 is formed to extend from a p type wall and the inner ring 116 toward the outer ring 113 farther than the floating ring 112, which does not form a sharp curve (reference numeral "130A" indicates a depletion layer in the case of providing no floating ring 112). Accordingly, it is possible to effectively release the electric field concentration.

However, in the above-referenced solid state relay, there is a problem in that, when a high voltage is applied between the drain and a source, a leak current via a first conductive region is increased since the inner ring 116 is provided at the outermost peripheral portion of the active area serving as a FET and has the same potential as that of the source region 104. Accordingly, it is required to prepare measures. Further, it is necessary to provide the inner ring 116 and the floating ring 112 as well as the outer ring 113. This causes an increase in the element area.

SUMMARY OF THE INVENTION

In view of the above, the present invention provides a solid state relay capable of reducing a leak current when a high voltage is applied.

In accordance with an aspect of the present invention, there is provided a semiconductor device including one or more transistor cells mounted on a first conductive type silicon carbide (SiC) substrate, wherein each of the transistor cells includes a second conductive type wall region formed on a first surface of the SiC substrate, a first conductive type source region formed in the wall region, a gate electrode formed with a gate insulating film; a source electrode formed in such a way as to be brought into contact with the source region, and a drain electrode formed on a second surface of the SiC substrate; and a second conductive type region located close to an outside of an outermost cell of the transistor cells and to surround the wall region, and insulated from any one of the gate electrode and the source electrode.

The second conductive type region may have a ring shape.

The SiC substrate may be configured by forming a first conductive type epitaxial growth layer having a lower concentration on a first conductive type high concentration region, and a distance between the second conductive type region and a transistor cell closest to the second conductive type region may be smaller than a thickness of the epitaxial growth layer formed below the wall region.

The distance between the second conductive type region and the transistor cell closest to the second conductive type region may be smaller than a distance between the adjacent transistor cells.

In accordance with another aspect of the present invention, there is provided a solid state relay including a light emitting element which emits lights in response to an input signal; a photodiode array which receives the lights and generates a power; a charge and discharge circuit connected to the photoelectric array in parallel; and the semiconductor device serving as an output FET whose gate and source are connected to opposite ends of the photodiode array.

In accordance with the aspects of the present invention, the second conductive type region located in vicinity of the transistor cells whose potentials are the same as that of the source electrode of the SiC-FET is electrically floated, so that no drain-source voltage is applied to the pn junction between the second conductive type region and the substrate. Accordingly, an effective pn junction area is reduced, so that the leak current of the pn junction can be decreased. Further, by merely adding the floating region, it is possible to reduce occupied areas, thereby improving the scaling-down of the elements.

BRIEF DESCRIPTION OF THE DRAWINGS

FIGS. 2A and 2B show a layout of transistor cells of an output element of the solid state relay, wherein

DETAILED DESCRIPTION OF THE EMBODIMENTS

Embodiments of the present invention will now be described with reference to the accompanying drawings which form a part hereof.

First Embodiment

Figure 1:
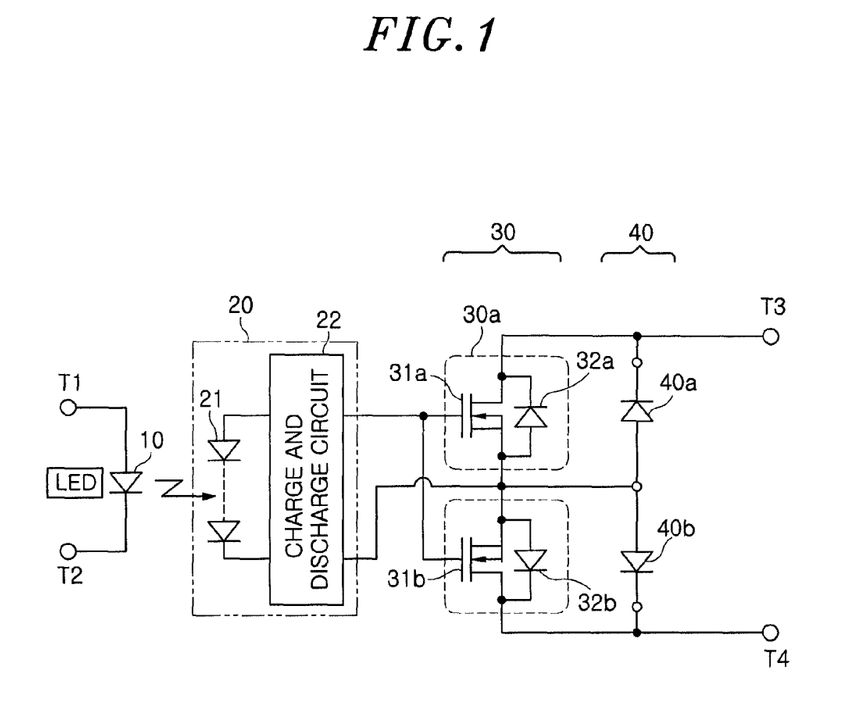
FIG. 1 is an equivalent circuit view showing a solid state relay in accordance with a first embodiment of the present invention.
Figure 2A:
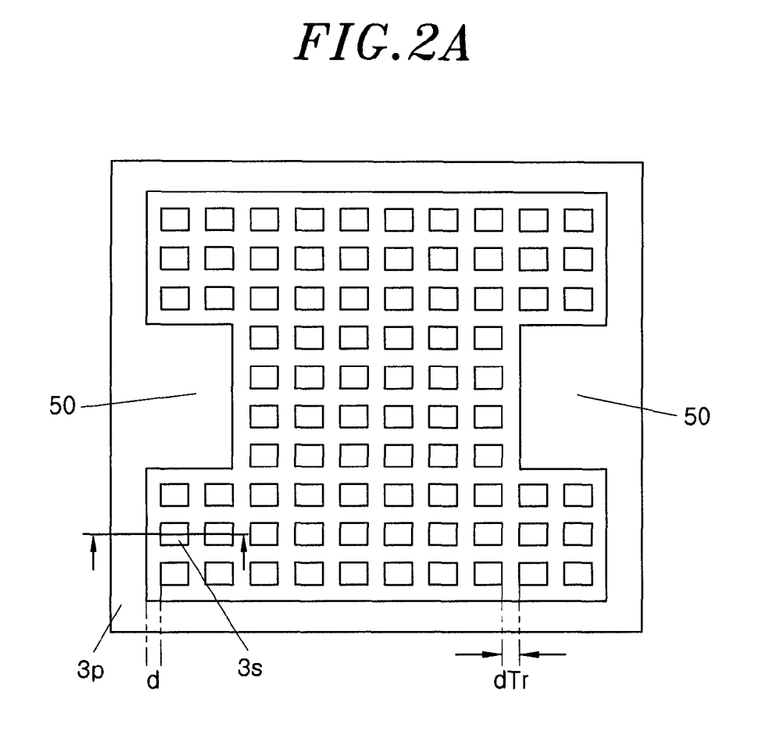
FIG. 2A shows a top surface of a chip and FIG. 2B shows a partially enlarged cross section thereof.
Figure 2B:
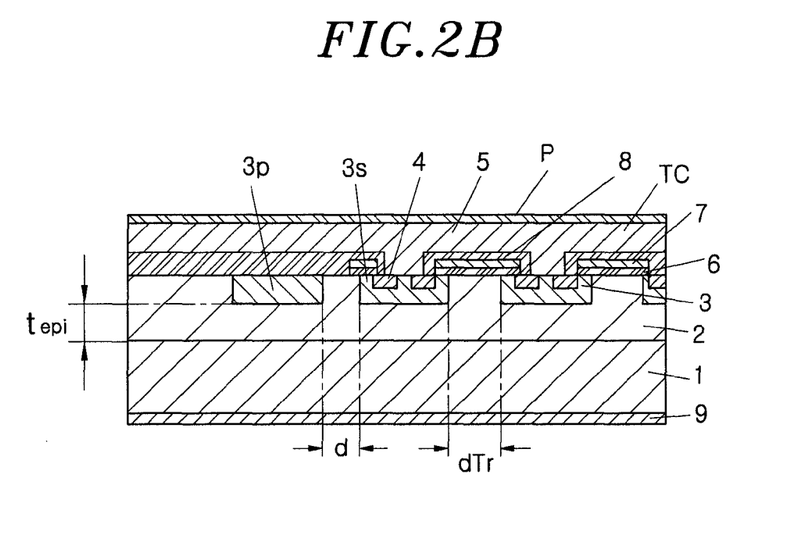

FIG. 1 is an equivalent circuit view showing a solid state relay in accordance with a first embodiment of the present invention, and FIGS. 2A and 2B show a layout of transistor cells of an output element 30 of the solid state relay, wherein FIG. 2A shows a top surface of this transistor chip and FIG. 2B shows a partially enlarged cross section thereof. In the solid state relay of the first embodiment, compound semiconductor devices, i.e., SiC-MOSFETs, 31a and 31b are used as transistors of the output element 30. The output element 30 is configured by forming a plurality of transistor cells "TC" on a first surface of a first conductive type, e.g., n type, SiC substrate 1.

The features of the output element 30 of the first embodiment is to include a second conductive type, e.g., p type, withstanding voltage maintenance region "$3p$" which is located close to the outside of a p type wall region "$3s$" of a corresponding outermost cell TC of the transistor cells TC and to surround the p type wall region $3s$ and p type wall regions 3, the region $3p$ being insulated from any one of a gate electrode 7 and a source electrode 5. As shown in FIG. 2A, the p type withstanding voltage maintenance region $3p$ has such a ring shape as to surround the transistor cells TC.

In other words, as shown in FIGS. 2A and 2B, the output element 30 of the first embodiment is configured by forming the p type withstanding voltage maintenance region $3p$ at an outside of the outermost p type wall region $3s$ of the p type wall regions 3 of the transistor cells TC to have a same depth as those of the p type wall regions 3. Further, the output element 30 is configured in such a way that a distance "d" between the p type withstanding voltage maintenance region $3p$ and the outermost transistor cell TC (i.e., the p type wall region $3s$ of the outermost transistor cell TC) is smaller than a thickness $t_{epi}$ of an n type epitaxial growth layer 2 formed below the p type wall regions 3 ($d<t_{epi}$). Here, "outermost" means "closest to the p type withstanding voltage maintenance region $3p$." The output element 30 is also configured in such a way that the distance d between the p type withstanding voltage maintenance region $3p$ and the p type wall region $3s$ of the outermost transistor cell TC is smaller than a distance dTr between the adjacent transistor cells TC (i.e., between the wall regions 3 or the wall regions 3 and $3s$ of the adjacent transistor cells TC) ($d<dTr$). At opposite recess portions 50 of the transistor chip, a gate pad and a source pad are respectively formed.

Furthermore, as in conventional transistor cells, the transistor cells of the first embodiment are configured by forming the epitaxial growth layer 2 on a surface of the n type SiC substrate 1 having a desired concentration by the epitaxy and the p type wall regions 3 in the epitaxial growth layer 2. The p type withstanding voltage maintenance region $3p$ and the p type wall regions 3 are formed in a same process to have a same depth.

Each of the transistor cells TC includes a second conductive type wall region 3 or $3s$ formed on the first surface of the SiC substrate 1; a first conductive type source region 4 formed in the wall region 3 or $3s$; the gate electrode formed with a gate insulating film 6; the source electrode 5 formed in such a way as to be brought into contact with the source region 4; and a drain electrode 9 formed on a second surface of the SiC substrate 1.

As described above, as a first conductive type impurity region, i.e., an n type region, the source region 4 is formed in each of the p type wall regions 3. The gate electrode 7 is formed in an upper layer of the source region 4 with the gate insulating film 6 therebetween. This gate electrode 7 is extended between the p type wall regions 3, or 3 and $3s$ of the adjacent transistor cells in order to control the formation of channel on the surfaces of the p type wall regions 3 or $3s$.

The source electrode 5 is formed in an upper layer of the gate electrode 7 with an insulating film, e.g., a silicon oxide film, 8 therebetween. This insulating film 8 is provided to cover the gate electrode 7 and an entire portion of the substrate surface except for a portion that is brought into contact with the source region 4 and a chip peripheral portion. Further, the drain electrode 9 is formed on the rear surface, i.e., the second surface, of the n type SiC substrate 1. Reference character "p" indicates a protective film formed of a polyimide film or the like to cover the substrate surface.

With such a configuration, a leak current of pn junction can be reduced by allowing no drain-source voltage to be applied to the pn junction between the substrate 1 and the p type withstanding voltage maintenance region $3p$ in the vicinity of the transistor cells TC insulated from the gate electrode 7 and the source electrode 5. As a result, it is possible to reduce the leak current. Further, it is not necessary to perform an additional process except for a process for changing a mask pattern since it is sufficient to perform only the process for forming the p type withstanding voltage maintenance region 3p at an outside of the outermost p type wall region 3s of the p type wall regions 3 of the transistor cells TC to have a same depth as those of the p type wall regions 3.

In addition, since the distance d between the withstanding voltage maintenance region 3p and the outermost p type wall region 3s is smaller than the thickness $t_{epi}$ of the n type epitaxial growth layer 2 formed below the p type wall regions 3 ($d<t_{epi}$), the withstanding voltage maintenance region 3p can be covered by the depletion layer before the depletion layer reaches the n type SiC substrate 1. Accordingly, it is possible to allow the withstanding voltage to approach to such a level that the depletion layer reaches a high concentration substrate. Further, since the distance d between the withstanding voltage maintenance region 3p and the outermost p type wall region 3s is smaller than the distance dTr between the adjacent transistor cells TC (d<dTr), it is possible to suppress the decrease in the withstanding voltage caused by the separation of distance from the transistor cells TC.

Besides, in the case of SiC, it has a strong resistance with respect to the bending of the depletion layer (i.e., electric field concentration) and it is difficult to decrease the withstanding voltage, it is possible to float the p type withstanding maintenance region 3p.

Furthermore, in views of the layout, it is not necessary to form a contact for the p type withstanding voltage maintenance region 3p. Accordingly, margins for pattern formation are not required. As a result, it is possible to decrease the chip area or increase the effective element surface area.

A manufacturing method of SiC-MOSFET will be described as follows.

Figure 3A:
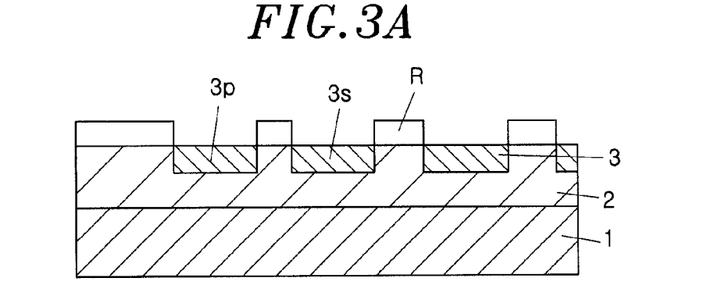
FIGS. 3A to 3D show a manufacturing process of a SiC MOSFET.

First, on the surface of an n⁺ type SiC wafer (substrate 1), the n type epitaxial growth layer 2 is formed by the epitaxy to have a desired concentration that is lower than that of the SiC wafer. Then, ion implantation is performed by using a first mask pattern R and p type impurity ions, and the p type withstanding voltage maintenance region 3p and the p type wall regions 3 and 3s of the transistor cells are formed under a non-reactive environment through an activation annealing process of about 1600° C. (FIG. 3A).

Figure 3B:
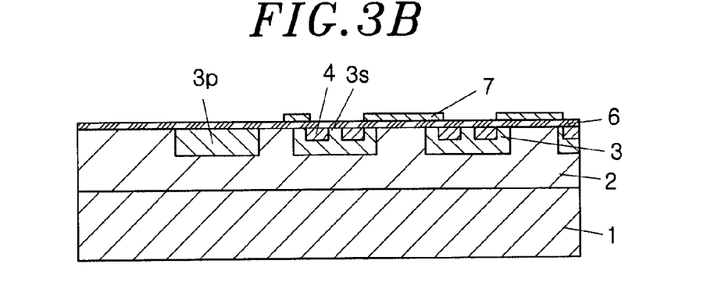
Figure 3C:
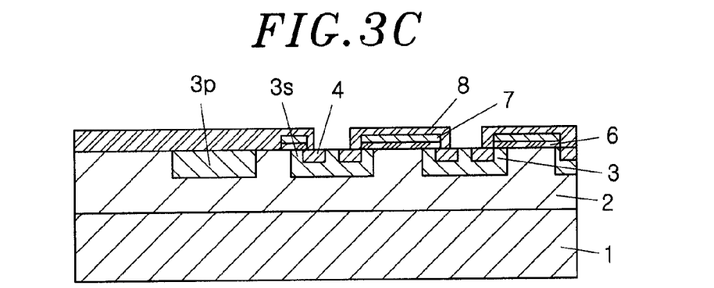

Successively, the mask pattern R is removed, and a second mask pattern is formed. Then, ion implantation is performed by using the second mask pattern and n type impurity ions, and the n type region serving as the source region 4 is formed under a non-reactive environment through an activation annealing process of about 1600° C. Then, a silicon oxide film serving as the gate insulating film 6 is formed through the thermal oxidation or the like. Thereafter, a polysilicon film is formed through the CVD or the like, and the patterning is performed by using a mask pattern formed through the photolithography to form the gate electrode 7 (FIG. 3B).

Figure 3D:
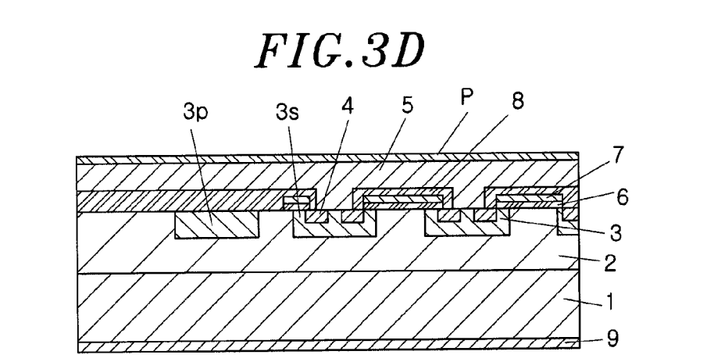

Then, a silicon oxide film 8 serving as the insulating film 8 is formed in an upper layer of the gate electrode 7 through the CVD, and the patterning is performed by using a mask pattern to form a contact window (FIG. 3D). Finally, a polyimide film or the like serving as the protective film P to thereby form the SiC-MOSFET shown in FIGS. 2A and 2B.

Next, a solid state relay using the SiC-MOSFET as an output element will be described.

Figure 4A:
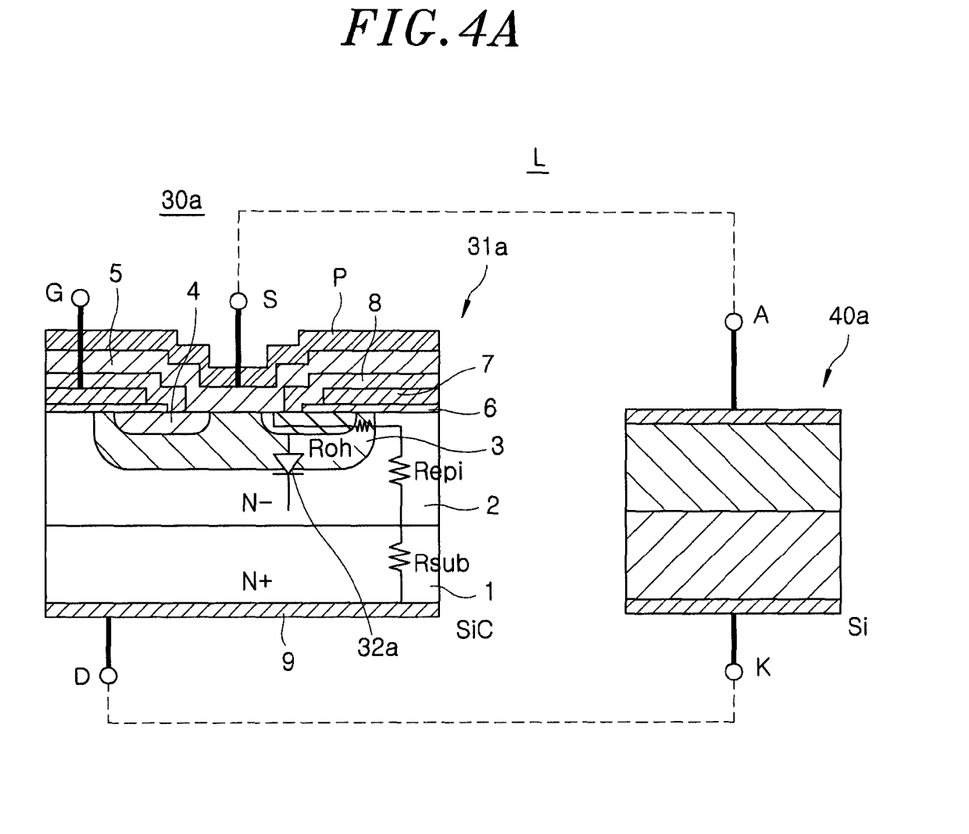
FIG. 4A shows an example of an output element chip to which a silicon diode is externally connected in accordance with the first embodiment of the present invention and FIG. 4B is an equivalent circuit view of FIG. 4A.
Figure 4B:
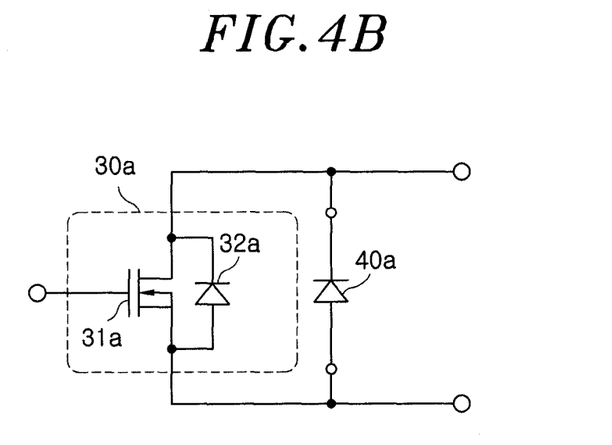

As a configuration of the output element is shown in FIGS. 4A and 4B, cathodes "K" of bypass silicon diodes 40a and 40b are respectively connected to drains "D" of SiC-MOSFETs 31a and 31b serving as the output elements 30a and 30b, and anodes "A" of the silicon diodes 40a and 40b are externally connected to sources "S" of the SiC-MOSFETs 31a and 31b, respectively, through a line "L" in anti-series.

FIG. 4A shows a connection example of the output element to which a silicon diode is externally connected in accordance with the first embodiment and FIG. 4B is an equivalent circuit view of FIG. 4A. In FIGS. 4A and 4b, only one SiC-MOSFET 31a and one silicon diode 40a are illustrated, but the same two SiC-MOSFETs and two silicon diodes are arranged as shown in FIG. 1. Further, built-in SiC body diodes 32a and 32b are respectively connected to the SiC-MOSFETs 31a and 31b serving as the output elements 30a and 30b in parallel.

In other words, as shown in FIG. 1, the solid state relay of the first embodiment includes a light emitting element 10; a photoelectric conversion device 20; and output elements 30 (30a and 30b). The light emitting element includes an LED having a first and a second input terminal T1 and T2. The photoelectric conversion device 20 includes a photodiode array 21 which produces an electromotive force in accordance with the light emission of the light emitting element 10 to output a corresponding voltage; and a charge and discharge circuit 22 which charges and discharges the voltage outputted from the photodiode array 21. The output elements 30 are turned on and off by applying an output voltage of the photodiode array 21 to a gate.

Here, the output elements 30 are two output elements, i.e., SiC-MOSFETs 31a and 31b each in which a line between the drain and the source is turned on and off. SiC body diodes 32a and 32b serving as protective elements are respectively connected to the SiC-MOSFETs 31a and 31b. The SiC body diodes 32a and 32b are built-in diodes each which is a pn junction diode formed between the p type wall region 3p and the epitaxial growth layer 2.

Gates "G" of the two SiC-MOSFETs 31a and 31b are respectively connected to an anode of the photodiode array 21 and, after sources thereof are connected to each other in anti-series, to a cathode of the photodiode array 21. Further, the drains of SiC-MOSFETs 31a and 31b are respectively connected to a first and a second output terminal T3 and T4.

Figure 5:
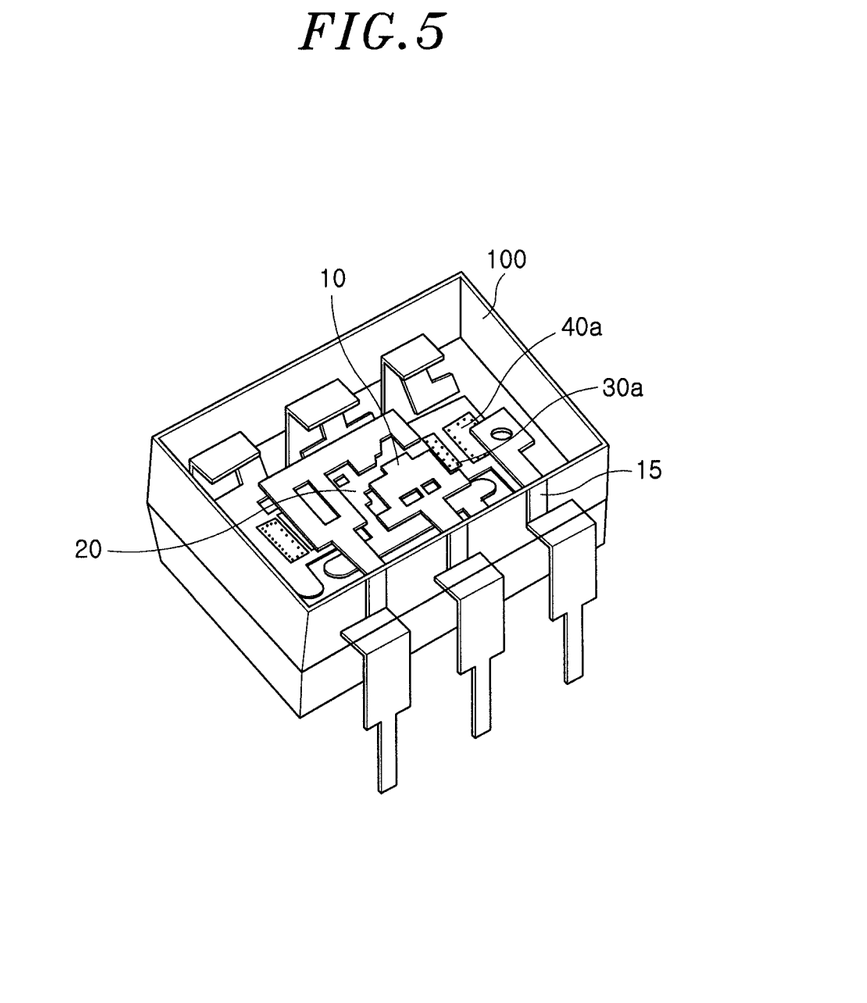
FIG. 5 is a broken perspective view showing the solid state relay in accordance with the first embodiment of the present invention.
Figure 6:
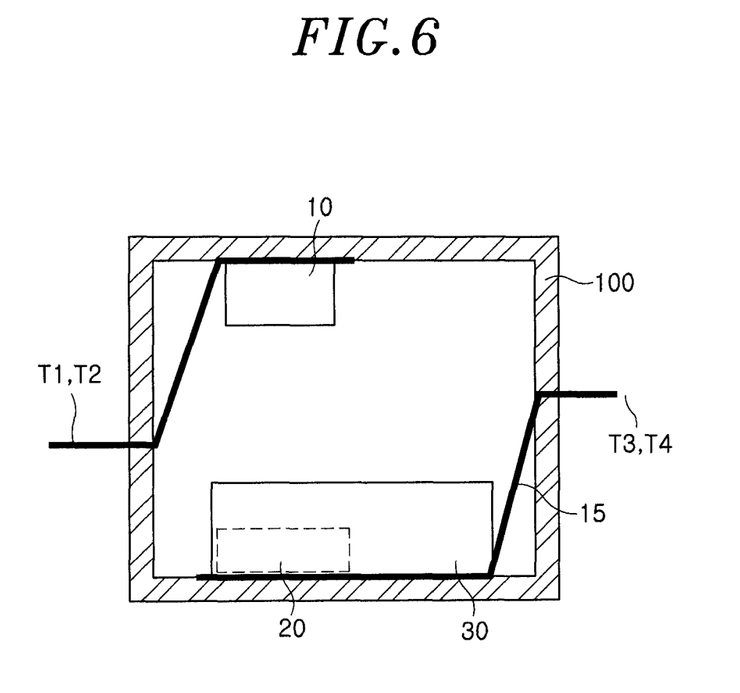
FIG. 6 is a schematic cross sectional view showing the solid state relay.

FIGS. 5 and 6 are a broken perspective view and a schematic cross sectional view, respectively, showing an example of the solid state relay. The solid state relay includes a lead frame 15 on which the light emitting element that is turned on and out in accordance with an input signal; the photoelectric conversion device 20 including the photodiode array 21 that receives an optical signal from the light emitting element 10 to produce an electromotive force by photoelectric conversion and the charge and discharge circuit 22 that charges and discharges a power generated by the photodiode array 21; and the output elements 30 including the SiC-MOSFETs 31a and 31b that are supplied with output voltages from the photoelectric conversion device 20, are mounted. When a gate voltage of the SiC-MOSFET reach a preset voltage level, the SiC-MOSFET becomes in a conducting state to turn on a load. Here, reference numerals "T1" and "T2," "T3" and "T4," and "100" indicate "input terminals," "output terminals" and "resin package," respectively. As shown in FIG. 6, the light emitting element 10 and the photoelectric conversion device 20 are mounted to face each other in such a way that a light emitted from the light emitting element 10 reaches the photodiode array 21.

Next, an operation of the above-configured solid state relay of the first embodiment will be described.

The light emitting element 10 emits lights in accordance with an input signal inputted from the first terminal T1 or the second terminal T2 to produce an optical signal. The photodiode array 21 receives the optical signal from the light emitting element 10 to produce an electromotive force at opposite ends thereof and outputs a thus-generated voltage.

The charge and discharge circuit 22 serves to charge and discharge the voltage outputted from the photoelectric array 21 to apply it to the gate of the SiC-MOSFET 31a or 31b serving as the output element 30 (30a or 30b). Then, if the output voltage of the photoelectric array 21 applied to the SiC-MOSFETs 31a and 31b is higher than a threshold voltage $V_{th}$, a drain-source line of the SiC-MOSFET 31a or 31b is turned on, and thus the first and the second output terminals T3 and T4 are connected to close the relay.

In the meantime, if the input signal is turned off in the first and the second input terminal T1 and T2, no voltage is outputted from the charge and discharge circuit 22, so that the drain-source line of the SiC-MOSFET 31a or 31b is turned on. Accordingly, the first and the second output terminals T3 and T4 are disconnected to release the relay.

As described above, the semiconductor element serving as the output element 30 employed in the solid state relay of the first embodiment can reduce a leak current and be scaled down. Accordingly, although a protective element is externally connected to the semiconductor element, the semiconductor remains its volume relatively small.

In this embodiment, as shown in FIGS. 1, 4A and 4B and 5, the output elements 30 are configured by connecting the SiC-MOSFETs 31a and 31b in anti-series, and chips of silicon diodes 40a and 40b are externally respectively connected to each of the SiC-MOSFETs 31a and 31b through each lead terminal of the lead frame 15. Accordingly, in the package 100, the bypass elements are respectively connected while suppressing the operations of parasitic elements (SiC body diodes 32a and 32b) in the SiC-MOSFETs 31a and 31b. (A forward-direction drop voltage $V_f$ (about 3 V) of a SiC pn diode serving as the built-in SiC body diode 32 is greater than a drop voltage $V_f$ (about 0.6 V) of the silicon diode. Accordingly, when a voltage is applied from the source (+) to the drain (−), if no silicon diode is provided, currents flowing through the SiC-pn diodes 32a and 32b respectively bypass the silicon diodes 40a and 40b). As a result, it is possible to prevent an increase in crystal defects caused by the power-on of SiC body pn diodes, thereby suppressing an increase in on resistance of the SiC-MOSFETs. As such, the output contact reliability of the relay can be maintained even when the relay is repeatedly used.

In the operation of the SiC body diode, when a voltage applied to the output element 30 becomes equal to or greater than its withstanding voltage in an instant, for example, the applied voltage equal to or greater than the withstanding voltage of the SiC-MOSFET 31a may also be applied to the SiC-MOSFET 31b. At this time, if the silicon diode 40b is not connected, the voltage is applied to the source-drain line of the SiC-MOSFET 31b, i.e., in the forward direction of the SiC body diode 32b.

This solid state relay has the following characteristics.

1) Since the externally connected silicon diodes are used as the protective elements, it is easy to manufacture a highly reliable semiconductor device with a simple configuration. Further, since the optical coupling is used, the input and the output can be completely separated from each other.

2) Since the power SiC-MOSFET is employed as the load switch, no chattering or mechanical noise is generated. Since the load switch has a high directionality in the ON state, it is possible to control an analog signal.

3) Since an output circuit is configured by connecting a FET in anti-series, it is available for AC and DC element.

Figure 7:
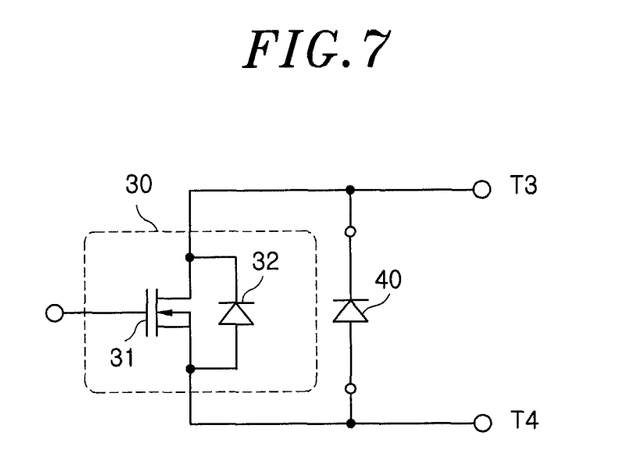
FIG. 7 is an equivalent circuit view showing a modification of an output element used in the solid state relay.

In the first embodiment, the two inversely connected SiC-MOSFETs 31a and 31b are used. However, as shown in FIG. 7, a single SIC-MOSFET 31 serving as the output element 30 may be employed, and one silicon diode 40 may be connected to the SiC-MOSFET 31.

Second Embodiment

Figure 8:
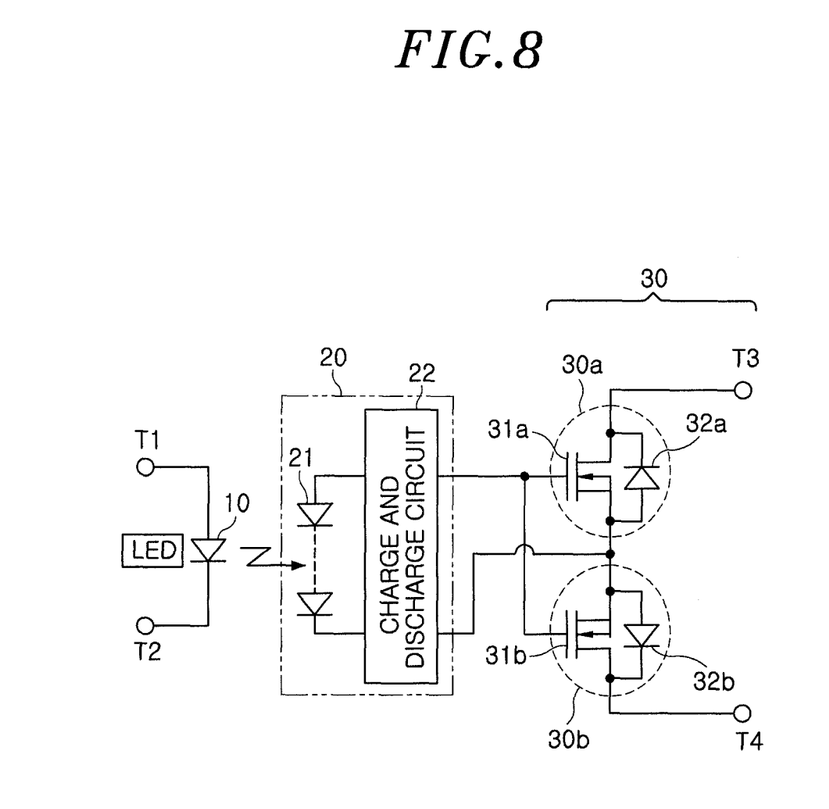
FIG. 8 is an equivalent circuit view showing an output element used in a solid state relay in accordance with a second embodiment of the present invention.

In a second embodiment of the present invention, a semiconductor device may be configured by employing the SiC-MOSFETs 30a and 30b only, as shown in FIG. 8, without additionally providing the bypass semiconductor element serving as the protective element 40 (see FIG. 1). The description related to the semiconductor device of the second embodiment is the same as that of the first embodiment except that the bypass semiconductor elements are provided. Accordingly, the redundant description thereof will be omitted.

In the first and the second embodiment, the SiC-MOSFETs are employed. Without being limited to the SiC-MOSFETs, SiC-based compound semiconductor FETs such as schottky gate FETs and the like may be employed.

While the invention has been shown and described with respect to the embodiments, it will be understood by those skilled in the art that various changes and modifications may be made without departing from the scope of the invention as defined in the following claims.

What is claimed is:

1. A semiconductor device comprising:
   one or more transistor cells mounted on a first conductive type silicon carbide (SiC) substrate,
   wherein each of the transistor cells includes:
   a second conductive type wall region formed on a first surface of the SiC substrate,
   a first conductive type source region formed in the wall region,
   a gate electrode formed with a gate insulating film;
   a source electrode formed in such a way as to be brought into contact with the source region, and
   a drain electrode formed on a second surface of the SiC substrate; and
   a second conductive type region located close to an outside of an outermost cell of the transistor cells, the second conductive type region surrounding the wall region and being insulated from both of the gate electrode and the source electrode.

2. The semiconductor device of claim 1, wherein the second conductive type region has a ring shape.

3. The semiconductor device of claim 1, wherein the SiC substrate is configured by forming a first conductive type epitaxial growth layer having a lower concentration on a first conductive type high concentration region, and
   a distance between the second conductive type region and a transistor cell closest to the second conductive type region is smaller than a thickness of the epitaxial growth layer under the wall region.

4. The semiconductor device of claim 1, wherein the distance between the second conductive type region and the transistor cell closest to the second conductive type region is smaller than a distance between the adjacent transistor cells.

5. A solid state relay comprising:
   a light emitting element which emits lights in response to an input signal;
   a photodiode array which receives the lights and generates a power;
   a charge and discharge circuit connected to the photoelectric array in parallel; and the semiconductor device of claim 1 serving as an output FET whose gate and source are connected to opposite ends of the photodiode array.

6. The semiconductor device of claim 2, wherein the SiC substrate is configured by forming a first conductive type epitaxial growth layer having a lower concentration on a first conductive type high concentration region, and a distance between the second conductive type region and a transistor cell closest to the second conductive type region is smaller than a thickness of the epitaxial growth layer under the wall region.

7. The semiconductor device of claim 2, wherein the distance between the second conductive type region and the transistor cell closest to the second conductive type region is smaller than a distance between the adjacent transistor cells.

8. A solid state relay comprising:

a light emitting element which emits lights in response to an input signal;

a photodiode array which receives the lights and generates a power;

a charge and discharge circuit connected to the photoelectric array in parallel; and the semiconductor device of claim 2 serving as an output FET whose gate and source are connected to opposite ends of the photodiode array.

9. A solid state relay comprising:

a light emitting element which emits lights in response to an input signal;

a photodiode array which receives the lights and generates a power;

a charge and discharge circuit connected to the photoelectric array in parallel; and the semiconductor device of claim 3 serving as an output FET whose gate and source are connected to opposite ends of the photodiode array.

10. A solid state relay comprising:

a light emitting element which emits lights in response to an input signal;

a photodiode array which receives the lights and generates a power;

a charge and discharge circuit connected to the photoelectric array in parallel; and the semiconductor device of claim 4 serving as an output FET whose gate and source are connected to opposite ends of the photodiode array.

\* \* \* \* \*